United States Patent [19]

Song et al.

[11] Patent Number: 4,911,765
[45] Date of Patent: Mar. 27, 1990

[54] METHOD FOR FABRICATING A MONOLITHIC INTEGRATION OF A LASER DIODE AND A WIDE APERTURE PHOTO DIODE

[75] Inventors: Jae-Kyung Song; Jong-Boong Lee, both of Seoul, Rep. of Korea

[73] Assignee: Samsung Electronics Co., Ltd., Gumi, Rep. of Korea

[21] Appl. No.: 189,330

[22] Filed: May 2, 1988

[30] Foreign Application Priority Data

May 9, 1987 [KR] Rep. of Korea .................. 87-4552

[51] Int. Cl.$^4$ .............. H01L 21/208; H01L 31/16; H01S 3/19
[52] U.S. Cl. .................................. 148/33.4; 148/33.5; 350/96.11; 372/50; 437/129; 437/130
[58] Field of Search .............. 437/129, 130; 357/19; 372/43, 50; 350/96.11; 148/33.4, 33.5

[56] References Cited

U.S. PATENT DOCUMENTS 4,470,143 9/1984 Kitamura et al. .................. 357/19
4,675,518 6/1987 Oimura et al. .................. 372/50

FOREIGN PATENT DOCUMENTS 59-197185 11/1984 Japan .................. 437/129

Primary Examiner—Olik Chaudhuri
Attorney, Agent, or Firm—Ladas & Parry

[57] ABSTRACT

A monolithic laser diode and photo diode is provided in a process in which a mesa is formed on a substrate, the mesa including two regions having different upper surface widths. A photoactive layer serving eventually as the active layer of the laser diode and the light detecting layer of the photo diode is formed on the mesa by means of a liquid phase epitaxy process in which the rate of growth of the layer is faster on the mesa region of greater surface width. This results in different layer thicknesses on the two mesa regions. The region with the thinner layer is thereafter incorporated into the laser diode, and the region with the thicker layer is incorporated into the photo diode. The thicker photo diode layer enhances the light capturing capacity of the photo diode.

1 Claim, 3 Drawing Sheets

METHOD FOR FABRICATING A MONOLITHIC INTEGRATION OF A LASER DIODE AND A WIDE APERTURE PHOTO DIODE

BACKGROUND OF THE INVENTION

This invention relates to a monolithic laser diode (LD) and a photo diode (PD) and more particularly to a method for fabricating a photo diode whose light detection layer is thicker than that of the active layer of the LD formed on a common substrate.

A LD is susceptible to variations of its light output, and therefore a PD is usually packaged in alignment with a rear facet of the LD to monitor the light output of the LD to control the light output of the LD, as shown in FIG. 1. Conventionally, the PD is integrated with the LD in a hybrid structure, and the photo current of the PD is fed to an Automatic Power Control (APC) circuit to stabilize the light output of the LD. However, the alignment of the PD with the LD and the electrical and optical matching between the PD and the LD cause many difficult problems in practical packaging.

Although a monolithic integration of a LD and a PD on a common substrate has heretofore been implemented, as shown in FIG. 2, for solving some of the aforementioned problems, one problem of the prior art devices is that the thickness of the light detection layer of the PD is limited to that of the active layer of the LD which is usually thin to optimize the characteristics of the LD. This is because both layers are simultaneously formed during fabrication of the integrated device. Therefore, the PD has a poor light coupling efficiency due to the thinness of its light receiving layers. It is a principal object of this invention to provide a monolithic LD and PD in which the thickness of the light detecting layer of the PD is greater than the thickness of the active layer of the LD, thereby increasing the area of the light receiving aperture of the PD. Another object is to provide a simple method for fabricating a monolithic LD and PD which uses an epitaxial layer growth rate difference depending on the width of a mesa etched pattern on the substrate.

Figure 1:
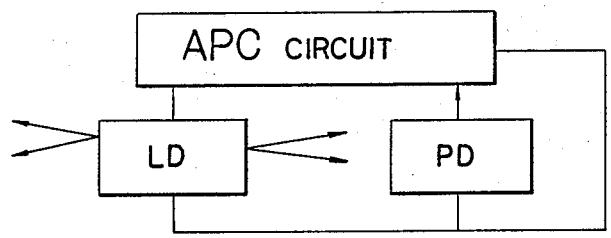
FIG. 1 is the block diagram of a conventional hybrid integrated laser diode module.
Figure 2:
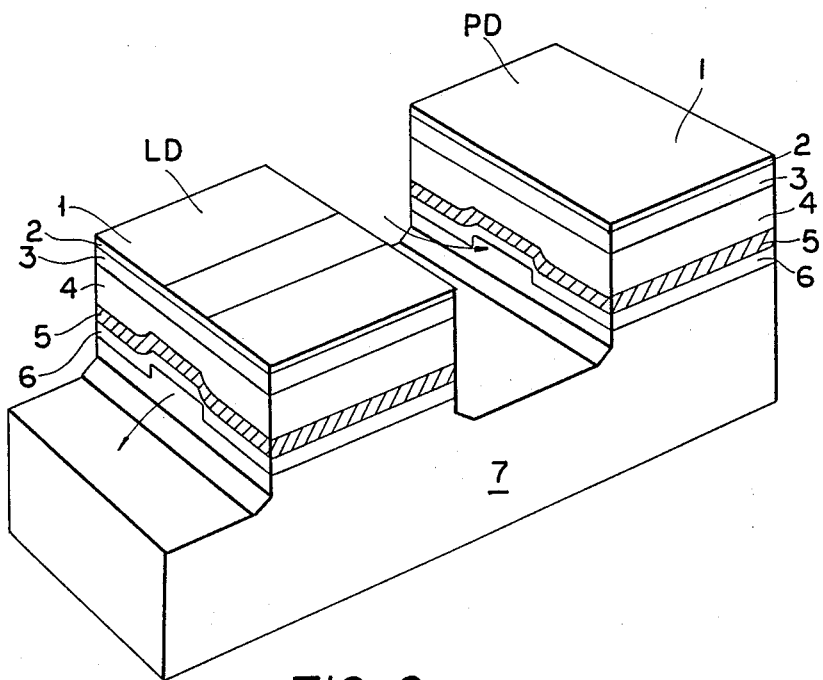
FIG. 2 is the schematic diagram of a monolithic conventional LD and PD.

The meaning of various symbols used in the drawings is as follows:

| | | | |
|---|---|---|---|
| PD | Photo Diode (for a monitor) | LD | Laser Diode |
| 1 | N-type electrode | 2 | $SiO_2$ |
| 3 | $N^+$—GaAs layer or $N^+$—InGaAs layer | | |
| 4 | N—$Al_xGa_{1-x}$As layer or N—InP layer ($0 \leq x < 1$) | | |
| 5 | undoped-$Al_yGa_{1-y}$As layer or undoped-$In_{1-z}Ga_zAs_wP_{1-w}$ layer ($y < x, 0 \leq y < 1, 0 \leq z, w < 1$) | | |
| 6 | P—$Al_xGa_{1-x}$As layer or P—InP | | |
| 7 | P-type substrate | | |
| 8 | P-type electrode | | |

DETAILED DESCRIPTION OF A SPECIFIC EMBODIMENT

Figure 4:
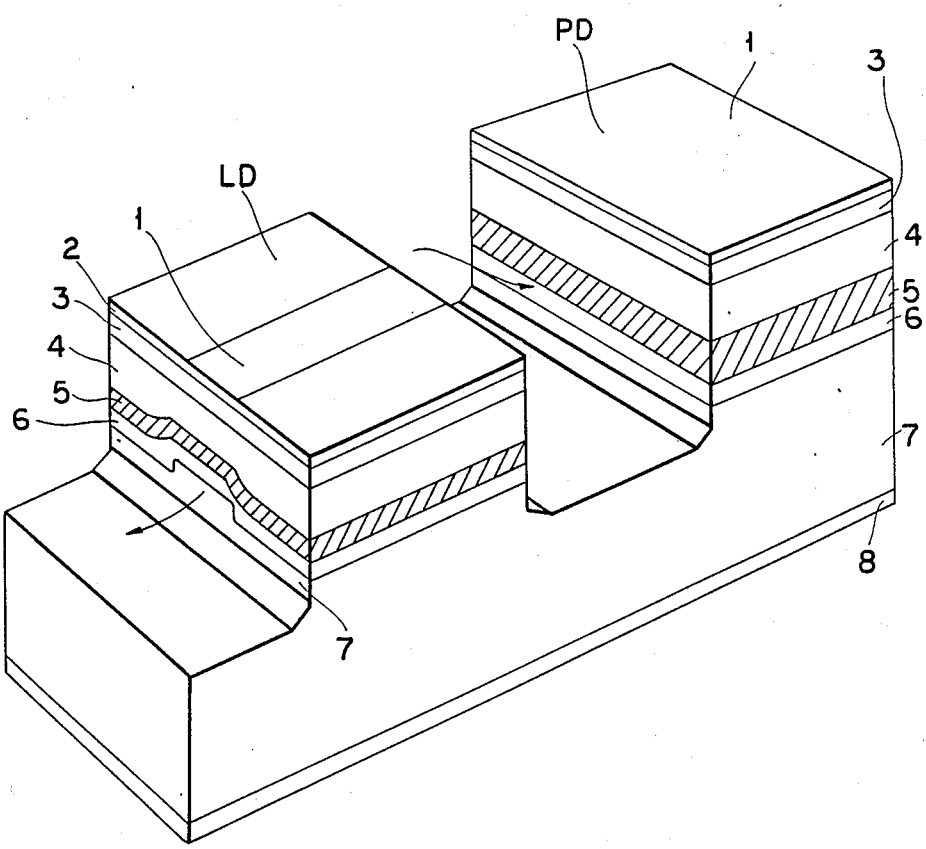
FIG. 4 is a schematic view of a monolithic LD and PD in accordance with this invention.
Figure 3:
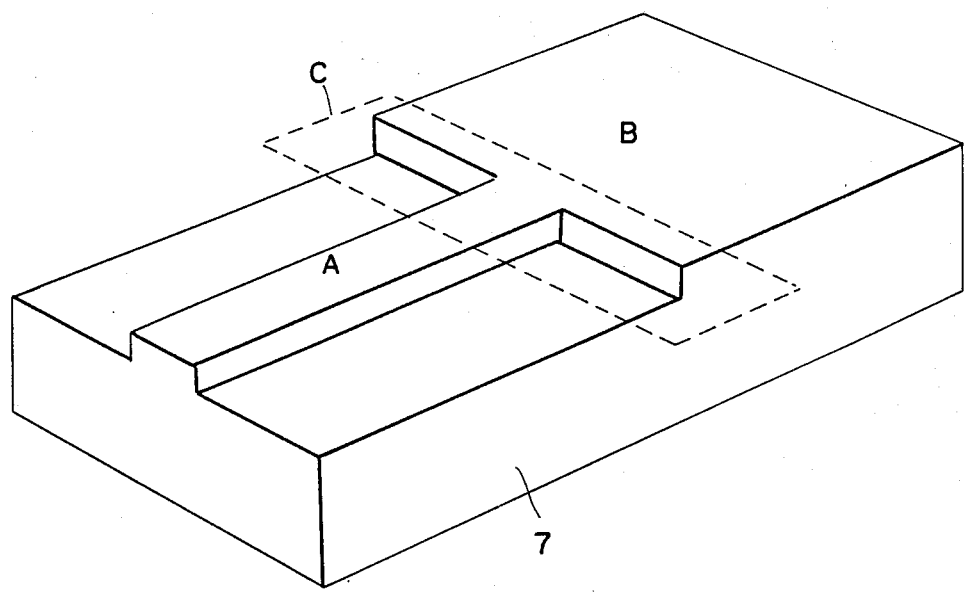
FIG. 3 is a view in perspective showing a mesa etched substrate in accordance with this invention.

Referring to FIG. 4, one embodiment of the invention is explained in detail. The important characteristic of this invention is to use a mesa etched substrate 7 which has different width regions A and B as shown in FIG. 3. The substrate may be a P-type compound semiconductor, especially such as GaAs or InP, etc., and is etched to form a mesa pattern which has both wide and narrow upper planes. After the mesa etching, epitaxial layers 3 through 6 are grown sequentially by the so called liquid phase epitaxy growth method. In this case, the epi-growth rates on the region A are different from those on the region B. The thickness of the epi-layer 5 on the mesa of the wide upper plane B becomes thicker than that on the mesa of narrow upper plane A. Therefore, the thickness of the epi-layer 5 of the PD, i.e., the light detection layer, is thicker than that of the in-situ grown active layer 5, i.e., the active layer of the LD.

After the growth of the epi-layers 3 through 6 is completed, the LD is separated from the PD by vertical etching of a region C shown in dashed lines in FIG. 3. The etching method used can be wet or dry etching. This etching step completes the fabrication of the monolithic LD and PD as shown in FIG. 4.

Figure 5:
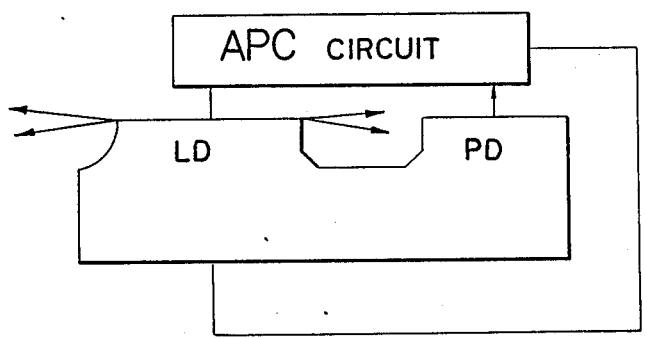
FIG. 5 is a schematic diagram showing the mechanism of operation of devices of this invention.

The thick epi-layer 5 of the PD, resulting in an enlarged light receiving aperture, enhances the light coupling efficiency by absorbing more light emitted from the LD than in conventionally integrated devices. Referring to FIG. 5, the photo current generated by the PD by absorption of the light emitted from the LD is fed to the APC circuit to control the intensity of the light emitted from the LD.

Wire and die bonding can be easily accomplished with the monolithic LD and PD of this invention due to the self alignment of the PD with the LD, and a stabilized light output from the LD can be easily obtained owing to the improved light coupling efficiency due to the enlarged PD light receiving aperture provided by this invention.

The invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What I claim is:

1. A monolithic laser diode and photo diode formed on a common substrate by a process including forming a mesa having regions of different upper surface widths on said substrate, forming a layer of a photoactive material on said mesa upper surface using a liquid phase epitaxy growth method in which the rate of growth of said layer is faster on the mesa region of greater upper surface width resulting in a greater thickness of said layer on said last mentioned region, adding additional layers to complete a laser diode incorporating the mesa region of smaller upper surface width and a photo diode incorporating the other of said mesa regions, and forming a light coupling medium between said laser diode and said photo diode.

* * * * *